United States Patent
Kutsumi et al.

(10) Patent No.: US 8,651,919 B2
(45) Date of Patent: Feb. 18, 2014

(54) ADHESIVE SHEET AND PROCESS FOR MANUFACTURING ELECTRONIC PART

(75) Inventors: Masanobu Kutsumi, Gunma (JP); Masashi Kume, Gunma (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 679 days.

(21) Appl. No.: 12/675,652

(22) PCT Filed: Aug. 30, 2007

(86) PCT No.: PCT/JP2007/066884
§ 371 (c)(1), (2), (4) Date: Oct. 12, 2010

(87) PCT Pub. No.: WO2009/028068
PCT Pub. Date: Mar. 5, 2009

(65) Prior Publication Data
US 2011/0059682 A1    Mar. 10, 2011

(51) Int. Cl.
*B23B 7/12* (2006.01)
*B24B 1/00* (2006.01)

(52) U.S. Cl.
USPC .......................... 451/41; 428/355 EP; 451/63

(58) Field of Classification Search
USPC ............. 428/355 AC, 355 EP; 451/36, 41, 63
See application file for complete search history.

(56) References Cited

U.S. PATENT DOCUMENTS

| | | | |
|---|---|---|---|
| 7,201,969 B2 | 4/2007 | Miyakawa et al. | |
| 7,479,317 B2 * | 1/2009 | Hashimoto et al. | 428/40.1 |
| 2003/0064579 A1 | 4/2003 | Miyakawa et al. | |
| 2005/0191456 A1 * | 9/2005 | Hashimoto et al. | 428/40.1 |
| 2006/0252234 A1 * | 11/2006 | Saiki | 438/464 |
| 2007/0276079 A1 * | 11/2007 | Saiki et al. | 524/493 |
| 2008/0108262 A1 * | 5/2008 | Asai et al. | 442/1 |
| 2010/0273313 A1 * | 10/2010 | Urairi et al. | 438/463 |

FOREIGN PATENT DOCUMENTS

| | | |
|---|---|---|
| EP | 2 003 685 A2 | 12/2008 |
| JP | 6 18190 | 3/1994 |
| JP | 08-259914 | 10/1996 |
| JP | 2000 8010 | 1/2000 |

(Continued)

OTHER PUBLICATIONS

Singapore Written Opinion issued Jun. 15, 2011, in Patent Application No. 201001312-6.

(Continued)

*Primary Examiner* — Timothy V Eley
(74) *Attorney, Agent, or Firm* — Oblon, Spivak, McClelland, Maier & Neustadt, L.L.P.

(57) ABSTRACT

An adhesive sheet comprising a sheetlike base material and, superimposed on one major surface thereof, an adhesive layer, wherein the average surface roughness on one major surface of the base material is in the range of 0.1 to 3.5 μm and on the other major surface thereof is in the range of 0.05 to 0.7 μm. In this structure, the average surface roughness values on both the major surfaces of the base material as a constituent of the adhesive sheet are regulated so as to fall within respective specified ranges, so that not only can any blocking occurring in backwinding of reeled adhesive sheet be inhibited but also any occurrence of minute unevenness (waving) on the wafer surface after grinding can be inhibited, and further that the transparency of the adhesive sheet can be maintained.

13 Claims, 1 Drawing Sheet

(56) References Cited

FOREIGN PATENT DOCUMENTS

| | | |
|---|---|---|
| JP | 2003 173994 | 6/2003 |
| JP | 2003-309088 | 10/2003 |
| JP | 2004 6746 | 1/2004 |
| JP | 3729584 | 12/2005 |
| JP | 2007 27474 | 2/2007 |

OTHER PUBLICATIONS

International Search Report issued Sep. 2, 2013 in PCT/JP07/066884.

* cited by examiner

ADHESIVE SHEET AND PROCESS FOR MANUFACTURING ELECTRONIC PART

CROSS REFERENCE TO RELATED APPLICATION

This application is a 371 of PCT/JP2010/066884, filed on Aug. 30, 2007.

TECHNICAL FIELD

The present invention relates to an adhesive sheet and a process for manufacturing an electronic part.

BACKGROUND ART

Due to recent advances in the performance of electronic devices such as cellular mobile telephones, the importance of grinding techniques has become broadly recognized. An adhesive agent that is able to firmly secure a work piece without transferring any foreign particles of a submicron order to the work piece when the agent is peeled off is desired in grinding processes. One of the known methods for securing a work piece is to use an adhesive sheet (see Patent Documents 1-3).

During the manufacture of an electronic part, an electronic part assembly forming a circuit pattern on a semiconductor wafer made of silicon or gallium-arsenide and the like, or an electronic part assembly forming a circuit pattern on a tabular insulating substrate and the like is often used. Moreover, with advances in the functional performance of electronic devices, various materials such as Si, $SiO_2$, $Si_3N_4$, AlSi, AlSiCu and PI have come to be used on the circuit patterns on semi-conductor wafers.

Patent Document 1: JP-B H06-018190
Patent Document 2: JP-A 2000-008010
Patent Document 3: Japanese Patent No. 3729584

DISCLOSURE OF THE INVENTION

Problems to be Solved by the Invention

However, the conventional art described in the above documents has room for improvement with regard to the following points.

First of all, back-grinding, which is characterized by securing the circuit side of an electronic part assembly to an adhesive sheet and grinding the back side of the circuit, is a popularly employed grinding process. However, when a conventional adhesive sheet is used in back-grinding, blocking tends to occur when unwinding the rolled adhesive sheet, and in some cases, the grinding process (back-grinding) further results in minute irregularities (waving) on the wafer surface.

Secondly, some users leave the protective sheet (adhesive sheet) intact and check the surface circuit patterns and lots through the tape. There is thus also a need for the protective sheet (adhesive sheet) to be transparent.

The present invention was conceived in view of the above circumstances, with the object of providing an adhesive sheet that can reduce blocking incidences during the unwinding of a rolled adhesive sheet, suppress occurrences of minute irregularities (waving) on ground wafer surfaces, and further has transparency. Additionally, another object of the present invention is to provide a process for manufacturing an electronic part using the adhesive sheet.

Means for Solving the Problems

The present invention provides an adhesive sheet comprising a sheet-like base material and an adhesive layer laminated on one surface of the base material, wherein the average surface roughness of one surface of the base material is at least 0.1 μm and at most 3.5 μm and the average surface roughness of the other surface of the base material is at least 0.05 μm and at most 0.7 μm.

This constitution allows the average surface roughness of both surfaces of the base material constituting the adhesive sheet to be adjusted within their respective specified ranges, thereby enabling the present invention to reduce blocking incidences during the unwinding of the rolled adhesive sheet, suppress occurrences of minute irregularities (waving) on ground wafer surfaces, and further maintain the transparency of the adhesive sheet.

Moreover, the present invention provides a process for manufacturing an electronic part, wherein the electronic part is obtained by grinding a wafer, comprising a step of applying a wafer to the adhesive layer surface of the adhesive sheet, and a step of grinding the exposed wafer surface smooth.

This process allows the average surface roughness of both surfaces of the base material constituting the adhesive sheet to be adjusted within their respective specified ranges, thereby enabling the present invention to reduce blocking incidences during the unwinding of the adhesive sheet, suppress occurrences of minute irregularities (waving) on the ground wafer surface, and further maintain the transparency of the adhesive sheet.

Effects of the Invention

The present invention allows blocking incidences during the unwinding of an adhesive sheet to be reduced, occurrences of minute irregularities (waving) on ground wafer surfaces to be suppressed, and the transparency of the adhesive sheet to be maintained.

BEST MODES FOR CARRYING OUT THE INVENTION

Herebelow, modes for carrying out the invention shall be explained with reference to the drawings. Since the same symbols are used to indicate the same structural components throughout the figures, explanations are omitted where it is appropriate.

<Description of Terminology>

In the present specification, a monomeric unit refers to a constitutional unit derived from a monomer. Parts and % in the present invention are by mass unless specifically indicated otherwise.

<Brief Overview of the Embodiments>

Figure 1:
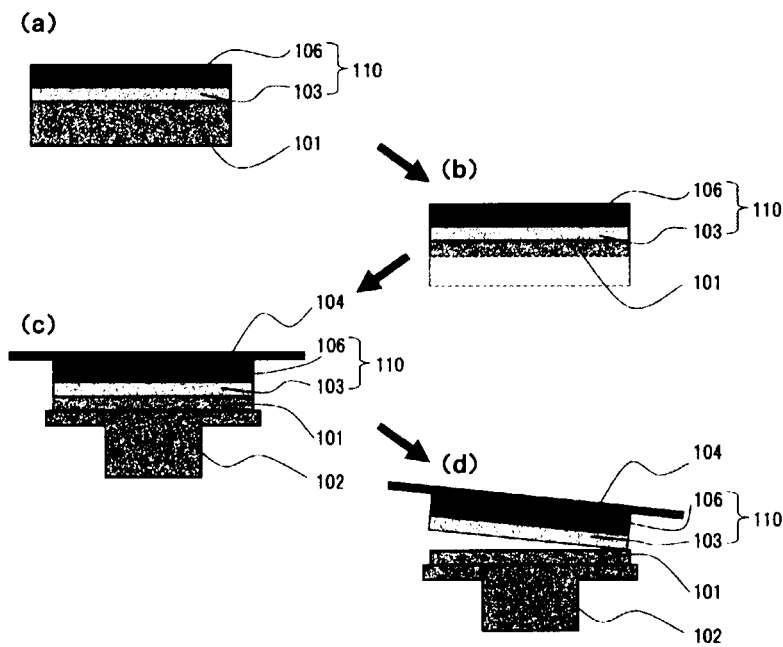
FIG. 1 A section view showing the steps in the back-grinding process of a wafer using an adhesive sheet.

FIG. 1 is a section view showing the steps in the back-grinding process of a wafer using an adhesive sheet. As shown in FIG. 1(a), an adhesive sheet 110 of the present embodiment comprises a base material 106 and an adhesive layer 103 laminated on one surface of base material 106.

With the average surface roughness of both surfaces of base material 106 constituting adhesive sheet 110 adjusted within the respective specified ranges, blocking incidences during unwinding of the rolled adhesive sheet 110 can be reduced, occurrences of minute irregularities (waving) on ground wafer surfaces can be suppressed, and the transparency of the adhesive sheet can further be maintained.

<Base Material>

For adhesive sheet 110 of the present embodiment, the average surface roughness (Ra1) of one surface (the surface coated with the adhesive) of the sheet-like base material 106 is preferably 0.1 μm or above, and is particularly preferred to be 1.0 μm or above. Keeping the average surface roughness (Ra1) above these lower bounds allows blocking incidences between base material 106 to be reduced when only base material 106, which constitutes adhesive sheet 110, is wound. On the other hand, this average surface roughness (Ra1) is preferably 3.5 μm or below, and is particularly preferred to be 3.0 μm or below. Keeping the average surface roughness (Ra1) below these upper bounds allows the transparency to be maintained and further allows occurrences of minute irregularities (waving) on the ground surface of semiconductor wafer 101 to be suppressed.

Moreover, in adhesive sheet 110 of the present embodiment, the average surface roughness (Ra2) of the other surface (the surface not coated with the adhesive) of sheet-like base material 106 is not particularly restricted as long as it is within a range that does not cause blocking. Specifically, it is preferably 0.05 μm or above and is particularly preferred to be 0.1 μm or above. Keeping this average surface roughness (Ra2) above these lower bounds allows blocking between base material 106 to be reduced when only base material 106, which constitutes adhesive sheet 110, is wound. On the other hand, this average surface roughness (Ra2) is preferably 0.7 μm or below, and is particularly preferred to be 0.4 μm or below. Keeping the average surface roughness (Ra2) below these upper bounds allows the transparency to be maintained, and further allows occurrences of minute irregularities (waving) on the ground surface of semiconductor wafer 101 to be suppressed.

For adhesive sheet 110 of the present embodiment, the stiffness of sheet-like base material 106 can be easily adjusted by using EVA (ethylene vinyl acetate). In other words, at least a part of sheet-like base material 106 preferably comprises ethylene vinyl acetate. Particularly, when an adhesive sheet is used in the grinding of semiconductor wafer 101 and the base material is too soft, the mechanical impact from the grinding head (not shown in drawings) results in the vertical motion of semiconductor wafer 101 and the wafer cannot be ground to an even thickness. Moreover, when sheet-like base material 106 is formed of multiple layers, at least one layer among the multiple layers should preferably comprise EVA (ethylene vinyl acetate). Since at least one layer of the multiple layers comprises EVA (ethylene vinyl acetate), this constitution also allows easy adjustment of the stiffness.

In order to adjust for the flexibility, the vinyl acetate content in the EVA (ethylene vinyl acetate) is preferably 3% or above by mass, and is more preferably 5% or above by mass. When the vinyl acetate content is above these lower bounds, the stress exerted during grinding can be absorbed, and therefore cracks in the ground semiconductor wafer 101 can be suppressed. On the other hand, in order to adjust for the flexibility, the vinyl acetate content in the EVA (ethylene vinyl acetate) is preferably 20% or below by mass, and is more preferably 15% or below by mass. When the vinyl acetate content is below these upper bounds, the degree of grinding precision of semiconductor wafer 101 can be improved.

For adhesive sheet 110 of the present embodiment, sheet-like base material 106 does not need to comprise only EVA (ethylene vinyl acetate); it may further comprise multiple materials. Methods employing multiple materials include methods that use mixtures, co-polymers, laminated films and the like.

For adhesive sheet 110 of the present embodiment, the thickness of sheet-like material 106 is not particularly restricted; however, to ensure the strength and to maintain the flexibility of adhesive sheet 110, the thickness is preferably at least 10 μm and at most 300 μm.

<Adhesive Layer>

For adhesive sheet 110 of the present embodiment, the adhesive used for adhesive layer 103 may contain acrylic polymers that allow easy engineering of the adhesive strength and curing agents that enable more precise adjustments of the adhesive strength. Moreover, at least one of the acrylic monomers constituting the acrylic polymers preferably contains a functional group-containing monomer. The functional group-containing monomer is preferably mixed and polymerized to have a concentration that is at least 0.01% and at most 10% of the acrylic polymers by mass. If the proportion of the functional group-containing monomer is 0.01% or above by mass, the adhesive strength towards the adherend is strong enough that water penetration tends to be suppressed. If the proportion of the functional group-containing monomer is 10% and below by mass, the adhesive strength to the adherend is not too strong and adhesive residues tend to be reduced.

Examples of the main monomers in the acrylic polymers include acrylic monomers such as butyl (meth)acrylate, 2-butyl (meth)acrylate, t-butyl (meth)acrylate, pentyl (meth)acrylate, octyl (meth)acrylate, 2-ethylhexyl (meth)acrylate, nonyl (meth)acrylate, decyl (meth)acrylate, lauryl (meth)acrylate, methyl (meth)acrylate, ethyl (meth)acrylate, isopropyl (meth)acrylate, tridecyl (meth)acrylate, myristyl (meth)acrylate, cetyl (meth)acrylate, stearyl (meth)acrylate, cyclohexyl (meth)acrylate, and benzyl (meth)acrylate.

It is especially preferable for a part of these acrylic monomers to be functional group-containing monomers. The functional group-containing monomers are preferably monomers with a functional group such as a hydroxyl group, a carboxyl group, an epoxy group, an amide group, an amino group, a methylol group, a sulfonate group, a sulfamate group or a phosphate (phosphite) ester group. Among the monomers, vinyl compounds having the above functional groups are particularly preferred, and vinyl compounds having a hydroxyl group are further preferred. Additionally, the vinyl compounds described here include the acrylates described below.

Examples of the functional group-containing monomers having a hydroxyl group include 2-hydroxyethyl (meth)acrylate, 2-hydroxypropyl (meth)acrylate, and 2-hydroxybutyl (meth)acrylate.

Moreover, adhesive layer 103 of the present embodiment, after the above acrylic polymers are allowed to read with a curing agent to cure adhesive layer 103, preferably comprises a carboxyl group-containing monomers, which constitutes the acrylic polymers, at 1% or below of the acrylic polymers by mass. In other words, among the functional group-containing monomers in the adhesive that have been reacted with a curing agent, the functional group-containing monomer having a carboxyl group is preferably present at 1% or below by mass. Since the use of a functional group-containing monomer having a carboxyl group increases the adhesive strength towards metals, when the functional group-containing monomer having a carboxyl group is above 1% by mass after its reaction with a curing agent, the adhesive strength towards metals is so strong that it tends to leave adhesive residues. It is therefore better to keep the monomer at 1% or below by mass. For this reason, the carboxyl group-containing monomer is preferably one easily degradable by a reaction with a curing agent. For example, (meth)acrylic acid, crotonic acid, maleic acid, maleic anhydride, itaconic acid, fumaric acid, N-(glycolic acid)acrylamide and cinnamic acid are preferably used.

For adhesive sheet 110 of the present embodiment, the adhesive used for adhesive layer 103 is preferably prepared with curing agents. When curing agents are included, the ratio is preferably at least 0.1 part and at most 20 parts of the curing agent by mass per 100 parts of the acrylic polymers by mass. When the ratio of the curing agent is at least 0.1 and at most 20 parts by mass, adhesive residues can be reduced.

The curing agents used for adhesive layer 103 may be polyfunctional isocyanate curing agents, polyfunctional epoxy curing agents, azirine compounds, melamine compounds and the like, and are more preferably polyfunctional isocyanate curing agents or polyfunctional epoxy curing agents. By using polyfunctional epoxy curing agents or polyfunctional isocyanate curing agents as at least a part of the above curing agents, the curing agents can selectively read with and degrade the functional group-containing monomer having a carboxyl group, and it is thus possible to adjust the content of the functional group group-containing monomer having a carboxyl group after curing.

Examples of the polyfunctional isocyanate curing agents may include aromatic polyisocyanate curing agents, aliphatic polyisocyanate curing agents and alicyclic polyisocyanate curing agents. Additionally, aliphatic polyisocyanate curing agents, especially hexamethylene diisocyanate curing agent, are preferred. This isocyanate curing agent is preferred for its ability to give flexibility to adhesives and its efficacy for rugged adherends.

There are no particular restrictions regarding the aromatic polyisocyanates. Examples may include 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, 2,4,6-triisocyanate toluene, 1,3,5-triisocyanate benzene, dianisidine diisocyanate, 4,4'-diphenyl ether diisocyanate, 4,4',4''-triphenylmethane triisocyanate, $\omega,\omega'$-diisocyanate-1,3-dimethyl benzene, $\omega,\omega'$-diisocyanate-1,4-dimethyl benzene, $\omega,\omega'$-diisocyanate-1,4-diethyl benzene, 1,4-tetramethyl xylylene diisocyanate, and 1,3-tetramethyl xylylene diisocyanate.

There are no particular restrictions regarding the aliphatic polyisocyanates. Examples may include trimethylene diisocyanate, tetramethylene diisocyanate, hexamethylene diisocyanate, pentamethylene diisocyanate, 1,2-propylene diisocyanate, 2,3-butylene diisocyanate, 1,3-butylene diisocyanate, dodecamethylene diisocyanate and 2,4,4-trimethyl hexamethylene diisocyanate.

There are no particular restrictions regarding the alicyclic polyisocyanates. Examples may include 3-isocyanatomethyl-3,5,5-trimethylcyclohexyl isocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylene bis (cyclohexyl isocyanate), 1,4-bis(isocyanatomethyl)cyclohexane and 1,4-bis(isocyanatomethyl)cyclohexane.

Polyfunctional epoxy curing agents may be basically compounds containing at least two epoxy groups and at least one tertiary nitrogen atom, including N,N-glycidyl aniline, N,N-glycidyl toluidine, m-N,N-glycidylaminophenylglycidylether, p-N,N-glycidylaminophenylglycidylether, triglycidyl isocyanurate, N,N,N',N'-tetraglycidyldiaminodiphenylmethane, N,N,N',N'-tetraglycidyl-m-xylylenediamine and N,N,N',N',N''-pentaglycidyldiethylenetriamine.

<Adhesive Sheet>

Adhesive sheet 110 of the present embodiment is made by forming adhesive layer 103 on base material 106. There are no particular restrictions regarding the method for the formation of adhesive layer 103 on base material 106. For example, common coating methods such as comma coating, lip coating, gravure coating, roll coating and screen coating may be used. Adhesive layer 103 may be directly formed on base material 106. Alternatively, adhesive sheet 103 may be formed on the surface of release treated release papers, then transferred to a base material film (base material 106).

The thickness of adhesive layer 103 of the present embodiment is preferably 3 μm or above, and is more preferably 5 μm or above. When the thickness is above these lower bounds, the irregularities on the circuit surface of semiconductor wafer 101 can be absorbed, thereby reducing the occurrence of dimples or cracks on the surface of semiconductor wafer 101. On the other hand, the thickness of adhesive layer 103 is preferably 1000 μm or below, and is more preferably 100 μm or below, because costs can be reduced when the thickness is below these upper bounds.

While there are no particular restrictions regarding the method of storing adhesive sheet 110 of the present embodiment, one method is to apply a piece of release sheet or release paper such as polyethylene laminated paper and release treated plastic film to the adhesive surface of adhesive layer 103.

<Method for Manufacturing Electronic Parts>

Adhesive sheet 110 of the present embodiment is used for grinding the back side of a semiconductor wafer. In other words, adhesive sheet 110 of the present embodiment can be favorably used for securing an assembly of semiconductor electronic parts in back-grinding. While there are no particular restrictions on the work piece of adhesive sheet 110, electronic part assemblies commonly called "works" are preferably used. When used in a back-grinding process, adhesive sheet 110 is adhered to the circuit surface formed on an electronic part assembly.

Electronic part assemblies may include those having a circuit pattern formed on an insulating circuit board (or semiconductor wafer 101). Materials constituting the circuit surface may be Si, $SiO_2$, $Si_3N_4$, AlSi, AlSiCu, PI or the like. Semiconductor wafers may include silicon wafers, gallium-arsenide and the like. Among these electronic part assemblies, semiconductor wafer 101 is preferably used.

<Back-Grinding>

The back-grinding process is not particularly restricted as to its procedures other than the step of securing adhesive sheet 110 onto the circuit side of an electronic part assembly and grinding the back side of the circuit. For example, the process may be preferably carried out with the following steps shown in FIG. 1.

(1) The first step is to mount and secure an electronic part assembly by suction onto a mechanical working chuck table so the circuit side of the electronic part assembly is in contact with adhesive layer 103 of adhesive sheet 110.

(2) The second step is to cut adhesive sheet 110 along the periphery of the electronic part assembly that has its circuit side stuck to adhesive sheet 110.

(3) The third step is to grind the electronic part assembly to a desired thickness.

(4) The fourth step is to release the suction of the chuck table and to remove the electronic part assembly secured by adhesive sheet 110 from the mechanical working table.

(5) The fifth step is to peel adhesive sheet 110 from the electronic part assembly and to retrieve the electronic part assembly.

One example of the method for peeling adhesive 110 from the electronic part assembly and retrieving the electronic part assembly is the following method shown in FIG. 1.

(1) The first step is to secure the ground surface side of an electronic part assembly onto a chuck table by suction.

(2) The second step is to apply an adhesive release film 104, commonly called a "release tape", to adhesive sheet 110.

(3) The third step is to peel off adhesive release film 104. Adhesive sheet 110, which is attached to adhesive release film 104, is peeled off from the electronic part assembly.

(4) The fourth step is to release the suction of chuck table 102 and to retrieve the electronic part assembly.

This method is preferably used when the thickness of the insulating circuit board (or semiconductor wafer 101) of the electronic part assembly is about 100 μm or above. The electronic part assembly is diced to yield electronic parts (chips).

When the electronic part assembly (or semiconductor wafer 101) is fragile, adhesive sheet 110 is peeled off from the electronic part assembly (or semiconductor wafer 101) to retrieve the electronic part assembly (or semiconductor wafer 101) by, for example, the following method comprising modifications of the steps shown in FIG. 1.

(1) The first step is to secure the ground surface side of an electronic part assembly (or semiconductor wafer 101) onto a dicing tape mounted on a mechanical working chuck table (not shown).

(2) The second step is to apply an adhesive release film 104, commonly called a "release tape", to adhesive sheet 110.

(3) The third step is to peel off adhesive release film 104. Adhesive sheet 110, which is attached to adhesive release film 104, is peeled off from the electronic part assembly (or semiconductor wafer 101).

This method is preferably used when the insulating circuit board (or semiconductor wafer 101) of the electronic part assembly is thin and fragile. The electronic part assembly is diced to yield electronic parts.

<Effects>

Herebelow, the effects of the present embodiment shall be described.

Adhesive sheet 110 of the present embodiment comprises a sheet-like base material 106 and an adhesive layer 103 laminated on one surface of base material 106. Moreover, by keeping the average roughness of one surface of base material 106 to at least 0.1 μm and at most 3.5 μm and the average roughness of the other surface of base material 106 to at least 0.05 μm and at most 0.7 μm in adhesive sheet 110, blocking that occurs during unwinding of rolled adhesive sheet 110 can be reduced, minute irregularities (waving) that occurs on the surface of ground semiconductor wafer 101 can be suppressed, and the transparency of adhesive sheet 110 can further be maintained.

Moreover, at least a part of base material 106 of adhesive sheet 110 of the present embodiment preferably comprises ethylene vinyl acetate. Since this embodiment allows the stiffness of base material 106 to be easily adjusted, the vertical motion of semiconductor wafer 101 caused by impacts from the grinding head (not shown) can be suppressed and semi-conductor wafer 101 can be easily ground to an even thickness.

Additionally, base material 106 of adhesive sheet 110 of the present embodiment may be formed of multiple layers, and at least one layer among the multiple layers may comprise ethylene vinyl acetate. Since this embodiment, like the above embodiment, allows the stiffness of base material 106 to be easily adjusted, the vertical motion of semiconductor wafer 101 caused by impacts from the grinding head (not shown) can be suppressed and semiconductor wafer 101 can be easily ground to an even thickness.

Furthermore, the vinyl acetate content of the above ethylene vinyl acetate in adhesive sheet 110 of the present embodiment is preferably at least 3% and at most 20% by mass. Since this embodiment allows stresses acting on adhesive sheet 110 during grinding to be absorbed, cracks in the ground semiconductor wafer 101 can be reduced. Additionally, since this embodiment allows the flexibility of adhesive sheet 110 to be adjusted, the degree of grinding precision of semiconductor wafer 101 can be enhanced.

Moreover, adhesive layer 103 of adhesive sheet 110 of the present embodiment preferably comprises acrylic polymers, because this constitution allows the adhesive strength of adhesive layer 103 to be easily engineered.

Additionally, at least one of the acrylic monomers constituting the above acrylic polymers is preferably a hydroxyl group-containing monomer. Since this constitution enhances the adhesive strength of adhesive layer 103 towards the adherend, water penetration can be reduced.

Furthermore, in adhesive sheet 110 of the present embodiment, the content of the above hydroxyl group-containing monomer is preferably at least 0.01% and at most 10% by mass in the acrylic polymers. This constitution not only enhances the adhesive strength of adhesive layer 103 towards the adherend to a degree that water penetration is reduced, it also prevents the adhesive strength of adhesive layer 103 towards the adherend from being overly strong, and so adhesive residues can be reduced.

Moreover, adhesive layer 103 of adhesive sheet 110 of the present embodiment preferably further comprises curing agents. Since this constitution prevents the adhesive strength of adhesive layer 103 towards the adherend from being overly strong, adhesive residues can be reduced.

Additionally, adhesive layer 103 of adhesive sheet 110 of the present embodiment preferably comprises at least 0.1 and at most 20 parts of the curing agents by mass per 100 parts of the acrylic polymers by mass. This constitution allows the adhesive strength of adhesive layer 103 towards the adherend to be adjusted within a moderate range, so adhesive residues can be reduced.

Furthermore, after the above acrylic polymers and curing agents react and cure adhesive layer 103 of adhesive sheet 110 of the present embodiment, the content of the carboxyl group-containing monomer constituting the acrylic polymers is preferably 1% or below by mass. Since this constitution prevents the adhesive strength of adhesive layer 103 towards metals from being overly strong, adhesive residues can be reduced.

Moreover, at least a part of the above curing agents of adhesive sheet 110 of the present embodiment preferably comprises a polyfunctional isocyanate curing agent. The reason for employing a polyfunctional isocyanate curing agent is that this curing agent can react with hydroxyl group and carboxyl group-containing monomers and thereby degrade them.

Additionally, the above polyfunctional isocyanate curing agent of adhesive sheet 110 of the present embodiment is preferably a hexamethylene diisocyanate curing agent. This hexamethylene diisocyanate curing agent is preferred because of its ability to give flexibility to adhesives and its efficacy for rugged adherends. Moreover, it can destroy hydroxyl and carboxyl groups by reacting with them, and the amount of functional group-containing monomers can be adjusted by particularly allowing the curing agent to selectively react with hydroxyl group-containing monomers.

Furthermore, at least a part of the above curing agents of adhesive sheet 110 of the present embodiment are preferably polyfunctional epoxy curing agents. Polyfunctional epoxy curing agents can react with both hydroxyl groups and carboxyl groups to degrade them. Polyfunctional epoxy curing agents, in particular, can selectively react with carboxyl group-containing monomers, and therefore the curing agents can selectively degrade these carboxyl groups. The amount of carboxyl group-containing monomers after curing can thus be adjusted.

Moreover, adhesive sheet 110 of the present embodiment is preferably used for grinding the back of semiconductor wafers (back-grinding). This is because, as described above, adhesive sheet 110 of the present embodiment can reduce blocking incidences during unwinding of rolled adhesive sheet 110, suppress occurrences of minute irregularities (waving) on the surface of semi-conductor wafer 101 after the back of the semiconductor wafer is ground (back-grinding), and can further maintain the transparency of adhesive sheet 110.

Additionally, the process for manufacturing an electronic part of the present embodiment is a process for manufacturing an electronic part by grinding semiconductor wafer 101, comprising a step of applying semiconductor 101 to the surface of adhesive layer 103 of the above adhesive sheet 110 and a step of grinding the exposed surface of semiconductor wafer 101 smooth while it is stuck to adhesive sheet 110.

The average surface roughnesses for both surfaces of base material 106 of adhesive sheet 110 used in this process are, as described above, adjusted within their specified ranges. For that reason, this process can reduce blocking incidences during unwinding of rolled adhesive sheet 110, suppress occurrences of minute irregularities (waving) on the ground surface of semiconductor wafer 101, and can further maintain the transparency of adhesive sheet 110.

The process for manufacturing an electronic part of the present embodiment may further comprise a step of peeling adhesive layer 103 from semiconductor wafer 101 after the above grinding process. Since the average surface roughnesses for both surfaces of base material 106 of adhesive sheet 110 used in this process are adjusted, blocking that occurs during unwinding of rolled adhesive sheet 110 can be reduced, minute irregularities (waving) that occurs on the ground surface of semiconductor wafer 101 can be suppressed, and the transparency of adhesive sheet 110 can further be maintained.

Moreover, this process can prevent blocking incidences during unwinding of rolled adhesive sheet 110, improve the grindability of semiconductor wafer 101 comprising various materials that form a circuit, and further provides the effect of preventing any contamination of a submicron order. In other words, while back-grinding processes using conventional adhesive sheets would have resulted in cases where adhesive residues of a submicron order are left on semiconductor wafer 101 comprising various materials, the present process can solve these problems.

Embodiments of the present invention have been described as above with reference to the drawings. However, they serve only as examples for the present invention; various constitutions other than the above may be adopted.

For example, the above embodiments did not place any particular restrictions on the type of semi-conductor wafer 101. However, any type of wafer (such as silicon wafers and gallium arsenide wafers) may be used. Since there is a suitable grinding head (not shown) for back-grinding of each type of wafer, processes for manufacturing electronic parts similar to the above embodiments can be carried out using suitable grinding heads (not shown), and similar effects may be achieved in such cases.

EXAMPLES

Herebelow, the present invention shall be further explained using examples. However, the present invention is not limited to these examples.

Example 1

Example 1 shows the recipes for manufacturing the adhesive sheet.
(Base Material)
Ethylene vinyl acetate base material: Commercially available pellets [manufactured by Tosoh Corporation, product name: Ultrasen (Urutorasen) 520F] mainly composed of ethylene vinyl acetate containing 8% vinyl acetate were dissolved and formed into a film by T-die co-extrusion. By controlling an embossing roller during the formation of the film, the average surface roughness (Ra1) of one surface of the base material was set at 2.0 µm and the average surface roughness (Ra2) of the other surface of the base material was set at 0.3 µm. Moreover, the thickness of the film was 120 µm.
(Adhesive)
A synthetic product comprising copolymers obtained by copolymerizing 80% butyl acrylate, 19% methyl(meth)acrylate and 1% 2-hydroxyethyl acrylate (functional group-containing monomer) was obtained. Moreover, the glass transition point of the synthetic product was −53.3° C.

Additionally, a polyfunctional isocyanate curing agent: hexamethylene diisocyanate (manufactured by Nippon Polyurethane Industry Co., Ltd., product name: Coronate HL) was further appropriately added to the above synthetic product to make an adhesive.

The adhesive was then applied to a PET separator film, coating the film so that the dried adhesive layer would have a thickness of 20 µm. The adhesive layer was then laminated onto the 120 µm-thick base material film to obtain an adhesive sheet.

Examples 2-4 and Comparative Examples 1-2

Aside from changing the average surface roughnesses of the base material surface not coated with the adhesive (Ra2) to the values shown in Table 1, Examples 2-4 and Comparative Examples 1-2 had the same settings as Example 1.

Examples 5-8 and Comparative Examples 3-4

Aside from changing the average surface roughnesses of the base material surface coated with the adhesive (Ra1) to the values shown in Table 1, Examples 5-8 and Comparative Examples 3-4 had the same settings as Example 1.
<Method for Evaluation>
(1) Grindability: As shown in FIG. 1, an adhesive sheet 110 was applied to a 5-inch mirror wafer (semiconductor wafer 101) [FIG. 1(a)], which was ground to a thickness of 300 µm [FIG. 1(b)]. The ground surface of the mirror wafer (semiconductor wafer 101) was then secured to a vacuum chuck table 102 [FIG. 1(c)] and adhesive sheet 110 was peeled off using a release film 104 [FIG. 1(d)]. The ground silicon wafer (semiconductor wafer 101) was then evaluated using a flatness measuring apparatus (Flatness Tester; ADE-9500). The results were rated "B" when the difference between the concavity and convexity on the surface was 5 μm or less; and "C" when it was 5μ or more. Results of the evaluation are shown in Table 1 below.

Mounter: Mounter ATM-1100 manufactured by Takatori Corporation
Grinder: Back Grinder DFG-850 manufactured by DISCO Inc.

Figure 2:
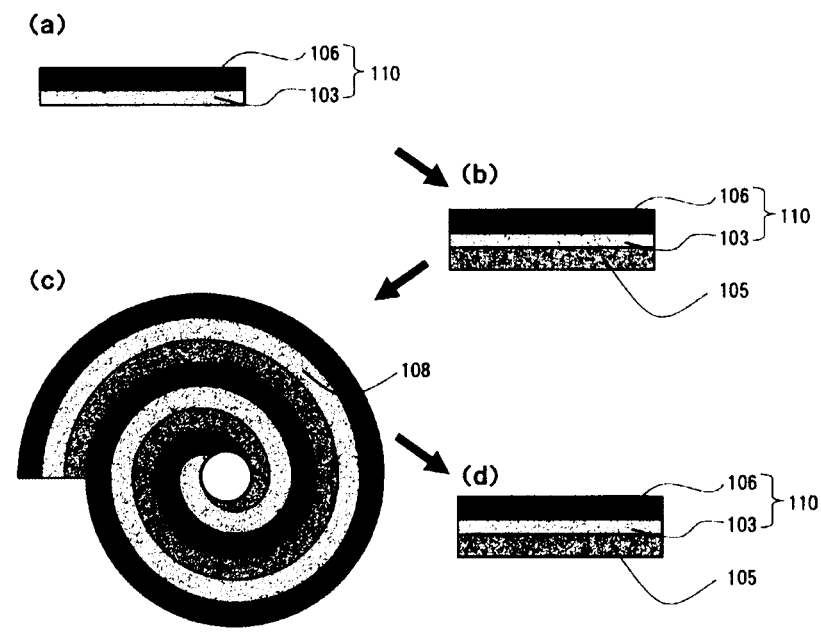
FIG. 2 A section view showing how blocking occurs during the winding and unwinding of an adhesive tape.
101 Silicon wafer
102 Vacuum chuck table
103 Adhesive layer
104 Release film
105 Release liner
106 Base material film
108 Rolled adhesive sheet with a release liner
110 Adhesive sheet

(2) Blocking: As shown in FIG. 2, after adhesive sheet 110 was made [FIG. 2(a)], it was applied to a release liner 105 [FIG. 2(b)] and wound into a roll [FIG. 2(c)]. Then, the results were rated "A" for those that did not have any blocking incidences during the unwinding of the adhesive sheet [between FIG. 2(c) and FIG. 2(d) (not shown)], "B" for those that had blocking but were still usable and "C" for those that had blocking and could not be used anymore. Results of the evaluation are shown in Table 1 below.

(3) Transparency: The transparency of the adhesive sheet was evaluated using a Haze Meter manufactured by Suga Test Instruments Co., Ltd. (HZ-2). The results were rated "A" for those with 0-20% HAZE, "B" for those with 20-40% HAZE and "C for those with 40-100% HAZE. Results of the evaluation are shown in Table 1 below.

TABLE 1

|  | Ex. 1 | Ex. 2 | Ex. 3 | Ex. 4 | Ex. 5 | Ex. 6 | Ex. 7 | Ex. 8 | Co. Ex. 1 | Co. Ex. 2 | Co. Ex. 3 | Co. Ex. 4 |
|---|---|---|---|---|---|---|---|---|---|---|---|---|
| Avg. surface roughness Ra1 [μm] | 2.0 | 2.0 | 2.0 | 2.0 | 0.2 | 1.0 | 3.0 | 3.3 | 2.0 | 2.0 | 0.08 | 4.0 |
| Avg. surface roughness Ra2 [μm] | 0.3 | 0.08 | 0.5 | 0.6 | 0.3 | 0.3 | 0.3 | 0.3 | 0.03 | 0.8 | 0.3 | 0.3 |
| HAZE [%] | A | A | B | B | A | A | A | B | A | C | A | C |
| Grindability | B | B | B | B | B | B | B | B | B | B | B | C |
| Blocking [—] | B | A | A | A | B | A | A | A | C | A | C | A |

<Test Analysis>

As can be seen from the test results shown in the table, adjusting the average surface roughness of the two surfaces of the base material constituting the present adhesive sheet within their respective specified ranges can reduce blocking incidences during the unwinding of the rolled adhesive sheet, and suppress occurrences of minute irregularities (waving) on the ground wafer surface, while allowing the transparency of the adhesive sheet to be maintained.

While the present invention has been explained using the Examples above, the examples only serve to illustrate the present invention. Various alternative modifications are possible, and those skilled in the art will understand that these alternative possibilities are also covered by the present invention.

INDUSTRIAL APPLICABILITY

The above adhesive tape reduces blocking during the winding of the base material, and blocking when put in the form of a tape, and has transparency. Moreover, the above adhesive tape can be used on various materials forming circuits and provide effects such as grindability and prevention of contamination of a submicron order.

The invention claimed is:

1. An adhesive sheet comprising a sheet-like base material and an adhesive layer laminated on one surface of the base material,
   wherein
   at least part of the base material comprises ethylene vinyl acetate,
   a vinyl acetate content of the ethylene vinyl acetate is at least 3% by mass and at most 20% by mass,
   a first surface of the base material has an average surface roughness of at least 1.0 μm and at most 3.3 μm,
   a second surface of the base material has an average surface roughness of at least 0.08 μm and at most 0.6 μm,
   the adhesive layer comprises an acrylic polymer comprising acrylic monomers, and
   at least one of the acrylic monomers is a hydroxyl group-comprising monomer.

2. A process for manufacturing an electronic part, the process comprising:
   grinding a wafer by applying the wafer to the adhesive layer of the adhesive sheet according to claim 1, and
   grinding an exposed surface of the wafer smooth while keeping the wafer stuck to the adhesive sheet.

3. The process according to claim 2, further comprising peeling the adhesive layer from the wafer after grinding.

4. The adhesive sheet according to claim 1, wherein the base material is formed of multiple layers and a layer of the multiple layers comprises ethylene vinyl acetate.

5. The adhesive sheet according to claim 4, wherein a content of the hydroxyl group-comprising monomer is at least 0.01% by mass and at most 10% by mass of the acrylic polymer.

6. The adhesive sheet according to claim 1, wherein a content of the hydroxyl group-comprising monomer is at least 0.01% by mass and at most 10% by mass of the acrylic polymer.

7. The adhesive sheet according to claim 1, wherein the adhesive layer further comprises a curing agent.

8. The adhesive sheet according to claim 7, wherein the adhesive layer comprises at least 0.1 part and at most 20 parts of the curing agent by mass per 100 parts of said acrylic polymer by mass.

9. The adhesive sheet according to claim 7, wherein at least a part of the curing agent is a polyfunctional isocyanate curing agent.

10. The adhesive sheet according to claim 9, wherein the polyfunctional isocyanate curing agent is a hexamethylene diisocyanate curing agent.

11. The adhesive sheet according to claim 7, wherein at least a part of the curing agent is a polyfunctional epoxy curing agent.

12. The adhesive sheet according to claim 7, wherein the adhesive layer is in cured form, and the content of carboxyl group-comprising monomers constituting the acrylic polymer is at most 1% of the acrylic polymer by mass.

13. The adhesive sheet according to claim 1, which is suitable for securing a circuit side of a semiconductor wafer to the adhesive sheet and grinding a back side of a semiconductor wafer.

* * * * *